(12) United States Patent
Kyotani et al.

(10) Patent No.: US 8,232,121 B2
(45) Date of Patent: Jul. 31, 2012

(54) ZINC OXIDE-BASED SEMICONDUCTOR DEVICE AND METHOD FOR PRODUCING SAME

(75) Inventors: Chizu Kyotani, Tokyo (JP); Naochika Horio, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 407 days.

(21) Appl. No.: 12/556,914

(22) Filed: Sep. 10, 2009

(65) Prior Publication Data

US 2010/0065843 A1 Mar. 18, 2010

(30) Foreign Application Priority Data

Sep. 12, 2008 (JP) .................................. 2008-234578

(51) Int. Cl.
*H01L 21/00* (2006.01)
*H01L 29/12* (2006.01)

(52) U.S. Cl. ..................... 438/33; 257/43; 257/E21.214; 257/E33.019

(58) Field of Classification Search ........... 257/E33.019; 438/33

See application file for complete search history.

(56) References Cited

U.S. PATENT DOCUMENTS

| 2002/0053665 A1* | 5/2002 | Tsuda et al. ..................... 257/14 |
| 2009/0121240 A1* | 5/2009 | Shakuda et al. ................ 257/94 |

FOREIGN PATENT DOCUMENTS

| JP | 2780618 B2 | 5/1998 |
| JP | 2861991 B2 | 5/1998 |

* cited by examiner

*Primary Examiner* — Lex Malsawma
(74) *Attorney, Agent, or Firm* — Holtz, Holtz, Goodman & Chick, PC

(57) ABSTRACT

A semiconductor device that has excellent characteristics and mass productivity wherein the introduction of defects thereinto at the time of device separation is prevented, and a method for producing the semiconductor device. In particular, there is provided a high-performance semiconductor device having excellent luminous efficiency, longevity and mass productivity; and a method for producing this semiconductor device. The method for producing the semiconductor device has a step of forming, between a substrate comprising zinc oxide (ZnO) and a device operating layer, a defect-blocking layer having a crystal composition that is different from that of the substrate, and a step of forming device dividing grooves to a depth that goes beyond the defect-blocking layer, relative to the device operating layer side surface of the substrate on which the device operating layer is formed.

22 Claims, 8 Drawing Sheets

ZINC OXIDE-BASED SEMICONDUCTOR DEVICE AND METHOD FOR PRODUCING SAME

BACKGROUND OF THE INVENTION

1. Field of the Invention

The present invention relates to a zinc oxide based semiconductor device and a method for producing same.

2. Description of the Related Art

Zinc oxide (ZnO) is a direct band gap semiconductor having a band gap energy of 3.37 eV at room temperature and holds promise as a material for use in optical devices in the blue-ultraviolet region. In particular, zinc oxide possesses physical properties that are especially suitable for semiconductor light-emitting devices; i.e., an exciton binding energy of 60 meV and a refractive index (n) of 2.0. Zinc oxide can be used not only in light-emitting devices and light-receiving devices, but also in surface acoustic wave (SAW) devices, piezoelectric devices, and the like. Furthermore, zinc oxide is inexpensive in terms of raw materials and has no adverse effects on the environment or the human body.

When semiconductor devices are cut from a wafer on which is formed a semiconductor crystal layer that constitutes the semiconductor device, device dividing grooves or scribes are formed on the wafer, and the devices are then separated using a knife edge or the like. For example, crystals having a zinc blende structure such as GaAs (gallium arsenide)-based compound semiconductors or InP (indium phosphide)-based compound semiconductors have a good cleavage property on the (110) face and therefore present little problem when semiconductor devices are cut from a wafer. However, wafers on which a nitride semiconductor layer having a wurtzite structure is formed have poor cleavage properties and are therefore likely to crack or exhibit other cutting defects (e.g., refer to Japanese Patent No. 2780618 (patent document 1), page 2, FIG. 1 and Japanese Patent No. 2861991 (patent document 2), page 2, FIG. 1).

For example, patent document 2 discloses a scribe on a wafer in which a nitride semiconductor layer is formed on a sapphire substrate, wherein dividing grooves are formed to a depth at which a part of the sapphire substrate is removed in order to prevent the occurrence of chip defects that cause the cutting line to curve, thereby preventing a straight cut. However, zinc oxide (ZnO)-based compound semiconductor crystals, which have the same hexagonal wurtzite structure as this nitride semiconductor albeit with different characteristics and physical properties, have not been sufficiently investigated in terms of the problems that occur during the device separation step.

SUMMARY OF THE INVENTION

The inventors have discovered that in a device separation step performed on a wafer in which a zinc oxide (ZnO)-based device structure (device operating layer) is formed on a ZnO substrate, lattice defects, which have a significant effect on the characteristics of the device, are transmitted from the device separation part to the device structure. The invention has been devised to solve this problem, which is particular to ZnO-based crystals. An object of the present invention is to provide a method for producing a semiconductor device making it possible to prevent defects from being introduced into a semiconductor device when it is separated from a wafer in which a ZnO-based compound semiconductor is formed on a ZnO substrate, and also to provide a semiconductor device having excellent device characteristics, longevity, and mass productivity. In particular, an object of the present invention is to provide a high-performance semiconductor device having excellent luminous efficiency, longevity, and mass productivity; and a method for producing same.

The semiconductor device production method of the present invention has a step of forming, between the substrate and the device operating layer, a defect-blocking layer having a crystal composition that is different from that of the substrate, and a step of forming a device dividing groove to a depth that goes beyond the defect-blocking layer, relative to the device operating layer side surface of the substrate on which the device operating layer is formed.

In addition, the device operating layer-equipped substrate of the present invention comprises a substrate made of zinc oxide, a defect-blocking layer formed on the substrate and having a crystal composition that is different from that of the substrate, a device operating layer formed on the defect-blocking layer, and device dividing grooves formed to a depth that goes beyond the defect-blocking layer, relative to the surface of the device operating layer.

The semiconductor device of the present invention is also characterized in being formed through breaking and segmenting the device operating layer-equipped substrate along the device dividing grooves.

The device dividing grooves in the present invention can be formed to a depth at which a part of the substrate is removed.

It is also possible for the defect-blocking layer to contain a plurality of ZnO-based compound semiconductor layers, layered so that mutually adjacent layers have different crystal compositions.

DESCRIPTION OF THE PREFERRED EMBODIMENTS

With reference being made to the accompanying drawings, a detailed description will now be given of a method for separating (segmenting) a semiconductor device from a wafer in which a zinc oxide (ZnO)-based compound semiconductor is formed on a zinc oxide substrate. A description will also be given of a semiconductor light-emitting device (LED: light emitting diode) as an example of the semiconductor device.

First Embodiment

Figure 1:
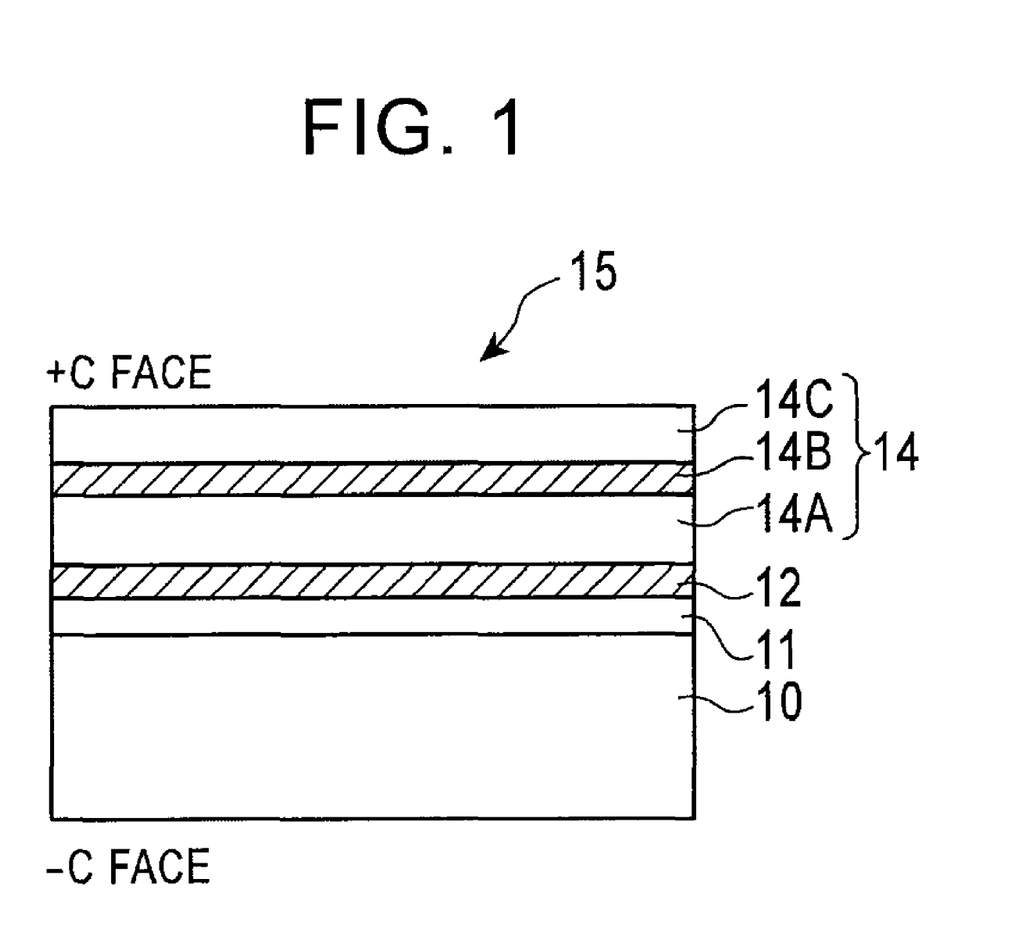
FIG. 1 is a cross-sectional view showing a substrate of the present invention comprising an LED operating layer, in which a zinc oxide (ZnO)-based compound semiconductor layer is formed on a ZnO substrate (10)

FIG. 1 is a cross-sectional view showing an LED operating layer-equipped substrate (15) of the present invention, in which a zinc oxide (ZnO)-based compound semiconductor layer (hereinafter called "ZnO-based semiconductor layer") is formed on a ZnO substrate (10).

The substrate (10) comprises a ZnO single crystal having the {0001} face of a wurtzite structure as the principal face (crystal growth face) and has a thickness of, for example, 500 μm. Using an RS-MBE (radical source molecular beam epitaxy) apparatus, a ZnO layer (11) having a thickness of 30 nm (nanometers), a defect-blocking layer (12), and an LED operating layer (14) are formed in the stated order on the ZnO substrate (10). The crystal growth method is not limited to RS-MBE; MOCVD (metal organic chemical vapor deposition) is also able to be used.

Here, the operating layer or device operating layer in this specification refers to a layer constituted from the semiconductor to be contained for the semiconductor device to exhibit the intended function. For example, a simple transistor contains a structural layer constituted from a p-n junction of an n-type semiconductor, a p-type semiconductor, and an n-type semiconductor (or a p-type semiconductor, an n-type semiconductor, and a p-type semiconductor).

In particular, what is referred to as a light-emitting operating layer is a semiconductor layer that is constituted from a p-type semiconductor, a light-emitting layer, and an n-type semiconductor (or a p-type semiconductor and an n-type semiconductor) and exhibits a light-emitting operation according to the recombination of injected carriers.

The LED operating layer (14) has a constitution whereby an n-type ZnO-based semiconductor layer (14A), a light-emitting layer (14B), and a p-type ZnO-based semiconductor layer (14C) are layered in the stated order. For example, the n-type ZnO-based semiconductor layer (14A) is a layer of $Mg_xZn_{(1-x)}O$ (x=0.1) having a thickness of 380 nm and doped with Ga (gallium) at a concentration range of $2-5\times10^{18}$ cm$^{-3}$. The light-emitting layer (14B) is an MQW (multiple quantum well) layer obtained by alternately laminating three pairs of a layer of $Mg_xZn_{(1-x)}O$ layer (x=0.1) and a layer of ZnO having thicknesses of 7 nm and 2.5 nm respectively. The p-type ZnO-based semiconductor layer (14C) has, for example, a structure obtained by laminating a layer of $Mg_xZn_{(1-x)}O$ (x=0.2) having a thickness of 100 nm and doped with N (nitrogen) at a concentration of $1\times10^{20}$ cm$^{-3}$ (first p-type ZnO-based semiconductor layer) with a layer of $Mg_xZn_{(1-x)}O$ (x=0.05) having a thickness of 10 nm and doped with N (nitrogen) at a concentration of $2\times10^{20}$ cm$^{-3}$ (second p-type ZnO-based semiconductor layer).

The defect-blocking layer (12) has a structure obtained by laminating a plurality of ZnO-based semiconductor layers in such a way that mutually adjacent layers have different crystal compositions. For example, the defect-blocking layer (12) has a structure obtained by alternately laminating three pairs of a layer of $Mg_xZn_{(1-x)}O$ (x=0.1) having a thickness of 20 nm and a layer of $Mg_xZn_{(1-x)}O$ (x=0.2) having a thickness of 20 nm.

Figure 2A:
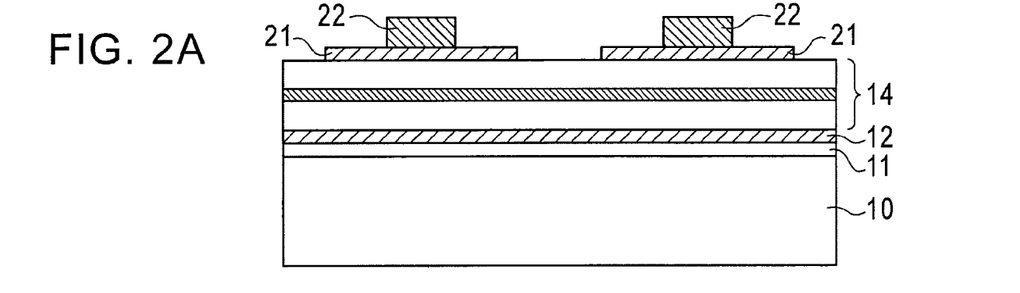
FIGS. 2A to 2D are diagrams illustrating a process for producing a semiconductor light-emitting device (LED) of the present invention.

Next, a description will be given of a process for producing semiconductor light-emitting device (LED) with reference made to FIGS. 2A to 2D. As shown in FIG. 2A, a p-side electrode (21) is formed by photolithography, EB (electron beam) deposition or another applicable technique. Firstly, an Ni (nickel) film having a thickness of 1 nm and then an Au (gold) film having a thickness of 10 nm are formed. A light-transmissive electrode (21) is then formed by performing a treatment for 30 seconds at a temperature of 450° C. in an atmosphere of nitrogen gas that contains 20% oxygen or a 100% oxygen gas atmosphere in an RTA (rapid thermal annealer).

Next, a p-side connection electrode (22) is formed using electron beam deposition to layer Ni, Pt, and Au films having thicknesses of 10 nm, 100 nm, and 1000 nm respectively in the stated order on the p-side electrode (21).

Figure 2B:
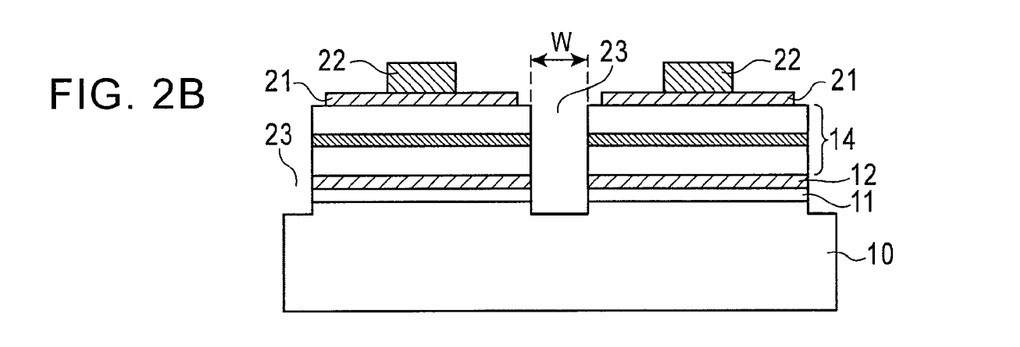

Next, a resist mask cut out in the shape of the device dividing grooves (23) is photolithographically formed on the surface on which the p-side connection electrode (22) is formed. Next, wet etching is carried out to a depth at which the LED operating layer (14), the defect-blocking layer (12), the ZnO layer (11), and a part of the ZnO substrate (10) are removed, as shown in FIG. 2B. Finally, the device dividing grooves (23) (dividing groove width: W, dividing groove depth: D, FIG. 2B) are formed by removing the resist. Specifically, the device dividing grooves (23) are etched to a depth beyond at least the defect-blocking layer (12). The etching process is not limited to wet etching, with the device dividing grooves (23) also able to be formed by dry etching. For example, it is possible to carry out the etching by, for example, RIE (reactive ion etching) using chlorine gas.

Figure 2C:
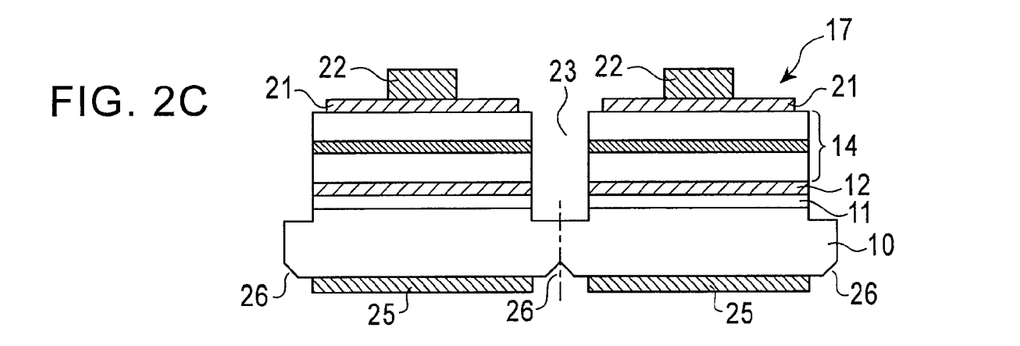
Figure 2D:
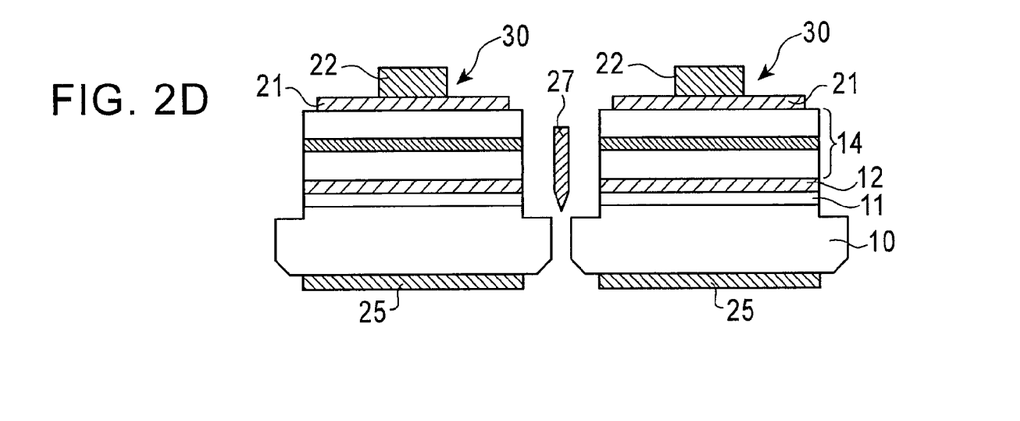

Next, the surface (p-side electrode (21) side) of the substrate (15) comprising the LED operating layer is attached to a grinding machine and polished until the surface to be polished (ZnO substrate (10) side) becomes a mirror surface (optical mirror surface). The thickness of the substrate (15) after polishing is approximately 200 μm. A resist mask cut out in the shape of an n-side connection electrode (25) is then photolithographically formed on the rear side of the substrate. Next, electron beam (EB) deposition is used to layer a Ti film having a thickness of 10 nm and an Au film having a thickness of 100 nm as the n-side connection electrode (25). Thereafter, the n-side connection electrode (25) is formed using a lift-off method to remove the deposited materials from those parts other than the cut-out mask parts by (FIG. 2C).

Figure 3A:
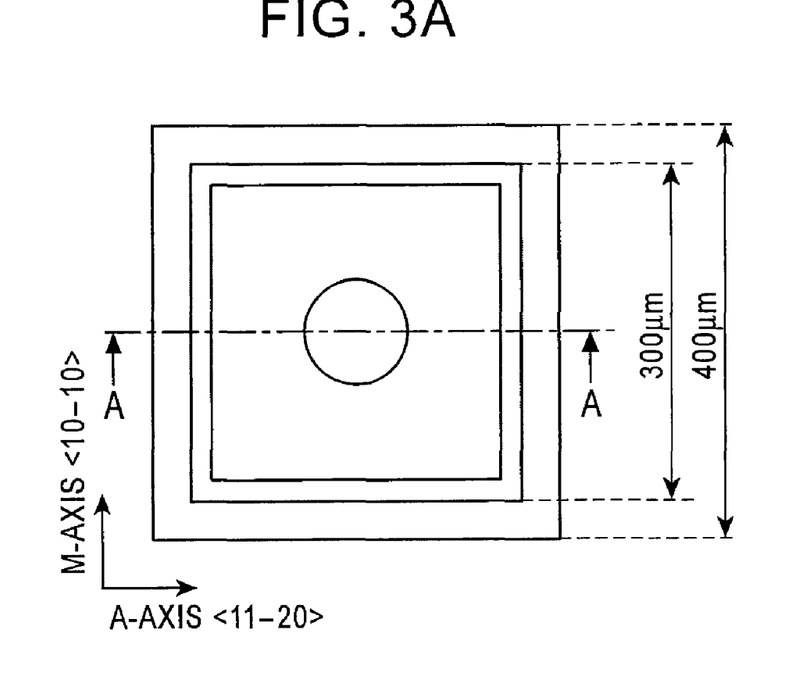
FIGS. 3A and 3B are a plan view showing an LED device of the present invention and a diagram showing a cross-section of the device along the line A-A respectively.
Figure 3B:
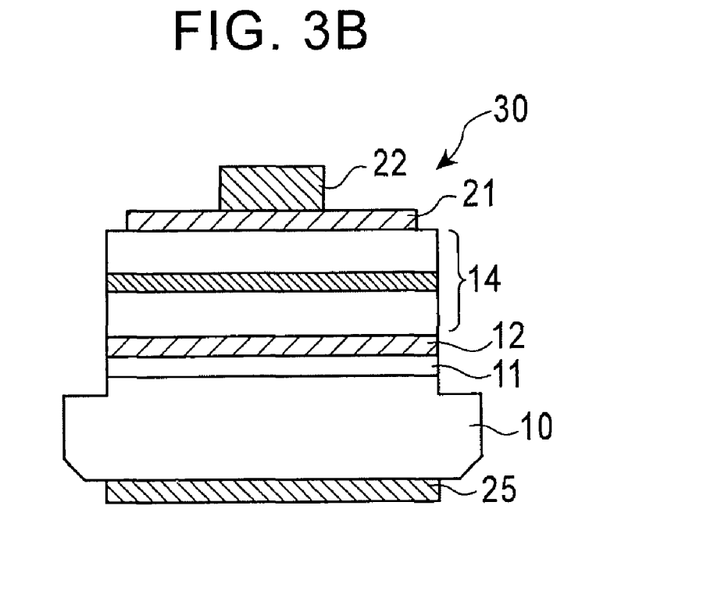

Next, after a protective sheet has been applied to the surface on which the electrode is formed, a scribe apparatus is used to form mutually perpendicular scribe grooves (26) on the rear surface at positions corresponding to the centers of the device dividing grooves (23). FIGS. 3A and 3B are, respectively, a plan view showing an LED device (30) (FIG. 3A) and a diagram showing a cross-section of the device along the line A-A (FIG. 3B). The scribe grooves (26) are formed in a lattice-like pattern in the a-axis <11-20> direction and the m-axis <10-10> direction. The device size of the LED device (30) is 400 μm square.

Next, in a breaking step, a knife edge (27) is placed on the device dividing groove (23) side of the substrate (the side opposite the scribe grooves (26)) and a load is applied to the knife edge (27) along a line corresponding to the scribe groove 26, so that the breaking follows the scribe groove direction. The substrate is then rotated 90° and breaking is similarly carried out in the direction of the scribe groove (26) perpendicular to the breaking scribe groove. More specifically, the ZnO layer (11), the defect-blocking layer (12), and the LED operating layer (14) are layered on the C-face ZnO substrate ({0001} face); and a semiconductor light-emitting device wafer (17) on which an electrode formation process has been performed is subjected to device separation (cleavage) in a rectangular pattern on the A face ({11-20} face), and the M face ({10-10} face), which is perpendicular to the A face. Specifically, the LED device (30) has a rectangular shape encompassed by the (11-20) face and the (10-10) face, which is perpendicular to the (11-20) face. The semiconductor light-emitting device wafer (17) is separated (segmented) via the steps described above (FIG. 2D), whereby the LED device (30) is produced.

The inventors of the present invention discovered that, when carrying out the cleavage by applying pressure with a knife edge in the step of breaking the semiconductor light-emitting device wafer (17) grown on a ZnO substrate, defects such as the crystal face slipping due to the pressure (edge dislocation and the like) are introduced. Specifically, it was clear that with device structures using conventional methods, scribes and breaking methods, lattice defects are introduced into the LED operating layer from the separation part when separating a device, luminous efficiency decreases, leakage current increases, and the longevity of the device deteriorates. This is because ZnO not only has poor cleavage properties, but, with a low Mohs hardness value of approximately 4, is also soft.

However, nitride crystals such as GaN, which have the same wurtzite structure as ZnO, are extremely hard, having a high Mohs hardness value of 9, meaning that lattice defects of the type and degree that greatly affect the characteristics of the device are not introduced into the crystal even if scribing, breaking, dicing or the like in the device separation step are causes of cracks and defects in the device. In addition, crystals of GaAs, which has a zinc blende structure and a similarly low Mohs hardness to ZnO, have good breakability; therefore, the problem of defects being introduced into the crystal does not occur even if the Mohs hardness value is low.

Specifically, the problem of lattice defects being transmitted to the device structure in the device separation step is a problem specific to ZnO-based compound semiconductors which have a wurtzite structure, poor breakability, and a low Mohs hardness value, and is a problem that was not recognized until now.

A defect-blocking layer (12) is provided in this embodiment. Specifically, the defect-blocking layer (12) is constituted as a layer obtained by alternately laminating one or more pairs of a layer of $Mg_{x1}Zn_{(1-x1)}O$ and a layer of $Mg_{x2}Zn_{(1-x2)}O$ (x1≠x2), these layers having different compositions, hardness values, and stress directions. The defect-blocking layer (12) is provided between the ZnO substrate (10) and the LED operating layer (14). In addition, the device dividing grooves (23) are formed by etching from the side of the surface on which the LED operating layer (14) is formed to a depth that goes beyond the interface of the ZnO substrate (10) and the grown layer.

Figure 4:
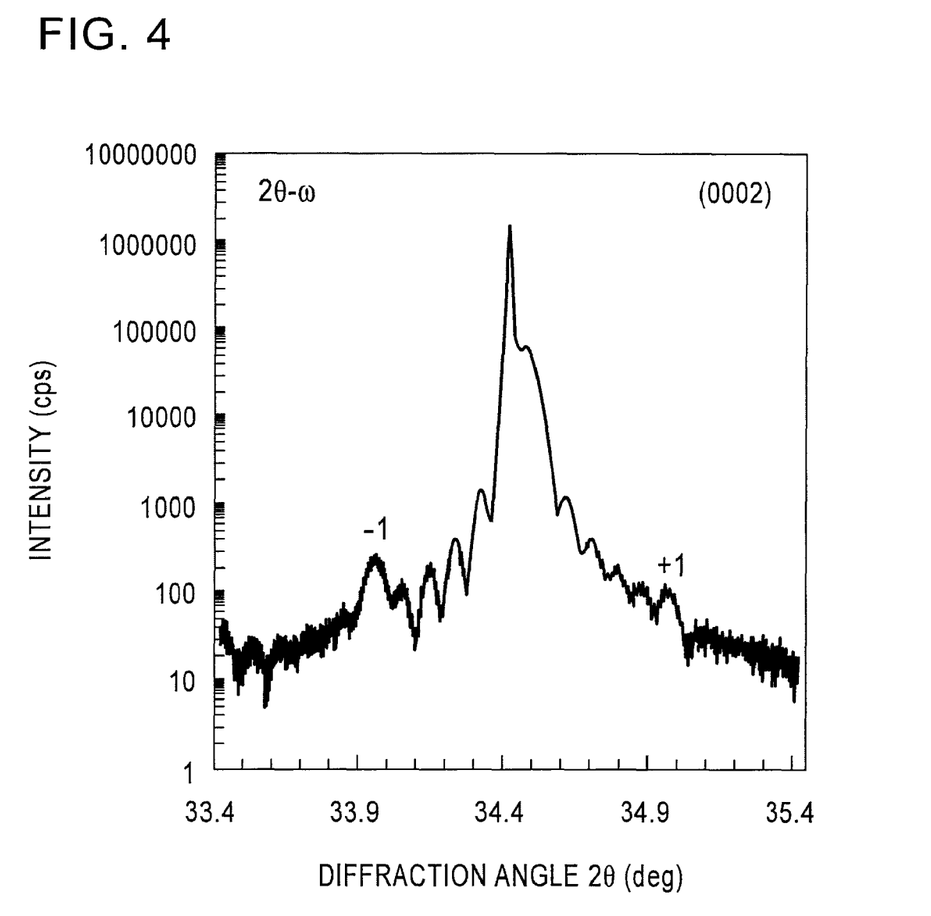
FIG. 4 is a diagram showing a 2θ-ω (X-ray) diffraction pattern of the (0002) face of an example in which six pairs of a ZnO/MgZnO multilayer thin film structure are grown as a defect-blocking layer on the {0001} face of a ZnO substrate.

FIG. 4 is a diagram showing a 2θ-ω (X-Ray) diffraction pattern of the (0002) face of an example in which six pairs of a layer of $Mg_{x1}Zn_{(1-x1)}O$ (x1=0) and a layer of $Mg_{x2}Zn_{(1-x2)}O$ (x2=0.2) are layered as the defect-blocking layer (12) on the {0001} face of a ZnO substrate.

The defect-blocking layer (12) can effectively block the transmission of defects due to having a constitution in which a plurality of pairs of layers comprising two or more layers having progressively different crystal compositions are provided. In a preferred layered state, the diffraction peak of the defect-blocking layer (12), the +1 and −1 satellite peaks based on the film thickness for a pair of layers, and the (N−2) fringes corresponding to the number of layers (N) are as shown in the illustrated diffraction pattern.

From the perspective of distortion and stress, the length of the a-axis in a free-standing $Mg_xZn_{(1-x)}O$ crystal increases and the length of the c-axis decreases in proportion to the value of x in the Mg crystal compositions. Conversely, the length of the a-axis in an $Mg_{x1}Zn_{(1-x1)}O$ (0≦x1≦0.68)/$Mg_{x2}Zn_{(1-x2)}O$ (0≦x2≦0.68) crystal used as a defect-blocking layer grown as a crystal on a ZnO substrate is the same as the length of the a-axis in the ZnO substrate if the values of x1 and x2 in the Mg crystal composition are 0.68 or less, but the length of the c-axis increases (becomes longer than the c-axis of the ZnO substrate). In this way, distortion and stress are inherent in the defect-blocking layer (12) and it is therefore possible to block the transmission of defects.

Figure 5:
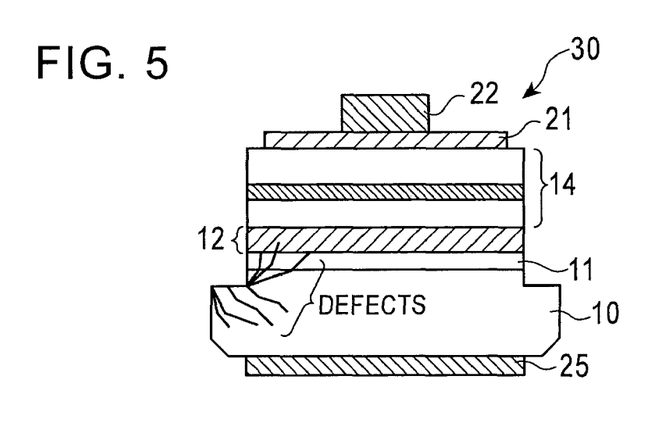
FIG. 5 is a diagram that schematically shows a defect-blocking layer having a plurality of layers and also schematically shows a device in which defects generated from a separation part in a device separation step are blocked by a multiplicity of defect-blocking layer interfaces.

Defects of the type that cause the crystal face to slip, as described above, are bent or stopped at interfaces between crystal layers having different crystal compositions grown on a substrate, interfaces between crystals having different hardnesses, and interfaces between layers having different lattice constants or layers having distortion. Therefore, the transmission of defects from the substrate side (device separation part) is blocked by a defect-blocking layer (12) having a plurality of this type of interface. FIG. 5 schematically shows both a defect-blocking layer (12) having a plurality of layers, and a device in which defects generated from a separation part in a device separation step are blocked by a multiplicity of defect-blocking layer (12) interfaces.

Moreover, from the perspective of defect blocking, it is preferable for the values of x1 and x2 in the compositions of the layers of $Mg_{x1}Zn_{(1-x1)}O$ and the layers of $Mg_{x2}Zn_{(1-x2)}O$ in the defect-blocking layer (12) to be such that 0≦(x1, x2)≦0.68, and 0.05≦|x1−x2|0.68. It is also preferable for the defect-blocking layer (12) to be provided with between 2 and 10 pairs of these $Mg_{x1}Zn_{(1-x1)}O$ and $Mg_{x2}Zn_{(1-x2)}O$ layers. Moreover, the layer thickness of the layers of $Mg_{x1}Zn_{(1-x1)}O$ layer and the layers of $Mg_{x2}Zn_{(1-x2)}O$ is preferably not less than 1 nm and not more than 50 nm, and more preferably not less than 5 nm and not more than 30 nm.

It is more preferable for at least one of the layers of the defect-blocking layer (12) to be a distorted crystal layer. It is further preferable for the defect-blocking layer (12) to be constituted as a multilayered structure. This is because a multilayered structure not only has a plurality of interfaces between different compositions, but also makes it possible to form a distorted layered structure in which layers having a larger degree of distortion than a crystal layer having a monostructure (bulk layer) and layers having a smaller degree of distortion than a crystal layer having a monostructure (or layers having no distortion) are layered.

Figure 6:
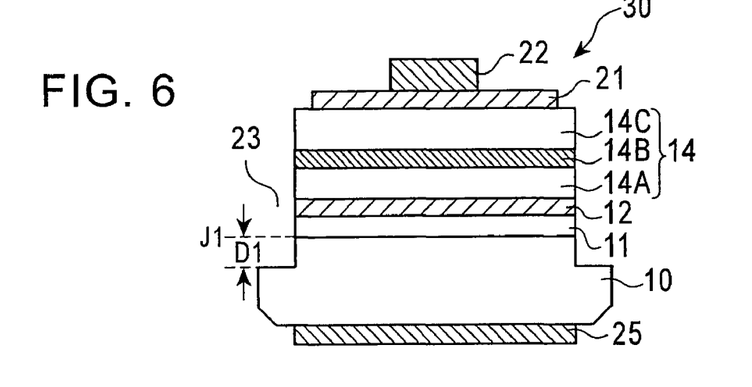
FIG. 6 is a diagram that schematically illustrates that a device dividing groove is formed from the surface side of a semiconductor light-emitting device wafer to a depth that goes beyond the interface (J1) (the substrate surface) between a ZnO substrate and a grown layer.

Moreover, the device dividing grooves (23) in the present invention are formed by etching from the surface side of the wafer (17) to a depth that goes beyond the interface (J1) between the ZnO substrate (10) and the grown layer (the surface of the substrate (10)), as shown in FIG. 6. Specifically, the device dividing grooves (23) are formed so as to remove at least the LED operating layer (14), the defect-blocking layer (12), the ZnO layer (11) and a part of the ZnO substrate (10)

(to a depth (D1) from the interface (J1), FIG. 6). It is thus preferable for the device dividing grooves (23) to be formed to a depth at which a part of the ZnO substrate (10) is removed. This is in order to prevent defects from being directly introduced into the grown layer. It is also preferable for the device dividing grooves (23) to be formed to a depth that goes beyond the substrate interface so as to make the distance to the LED operating layer (14) longer. This is particularly effective for defects introduced from the boundary between the bottom of the device dividing groove and the dividing side surface. The depth of the groove from the substrate interface should be 0.5 μm or more, preferably 1 μm or more, and more preferably 3 μm or more. The ZnO layer (11) does not have to be provided.

Figure 7:
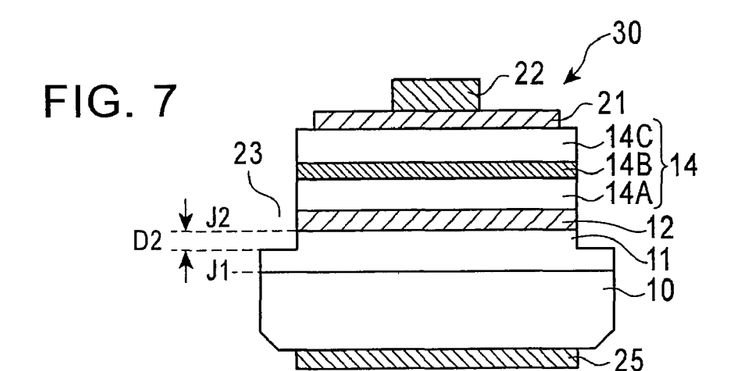
FIG. 7 is a diagram that schematically illustrates that a device dividing groove is formed through removal from the surface side of a semiconductor light-emitting device wafer to a depth that goes beyond the interface (J2) between a defect-blocking layer and a grown ZnO layer.

If a semiconductor layer (ZnO layer (11)) is provided between the ZnO substrate (10) and the defect-blocking layer (12), as in the present embodiment, the device dividing grooves (23) may be formed from the surface side of the wafer (17) to a depth that goes beyond at least the defect-blocking layer (12). Specifically, the device dividing grooves (23) may be etched to a depth that goes beyond the interface (J2) between the defect-blocking layer (12) and the ZnO layer (11); i.e., so as to remove a part of the ZnO layer (11) (to a depth (D2) from the interface (J2)), as shown in FIG. 7.

It is preferable for the width of the device dividing grooves (23) to be wide so as to make the distance from the device separation part to the device divide longer. Specifically, the width of the device dividing grooves is preferably 30 μm or more, more preferably 60 μm or more, and further preferably 100 μm or more.

As described above, defects generated from the device separation part are blocked by the defect-blocking layer (12) and not transmitted to the LED operating layer (14), and it is therefore possible to produce a high-performance semiconductor light-emitting device that not only exhibits excellent luminous efficiency and longevity, but also excellent mass productivity.

Second Embodiment

Figure 8:
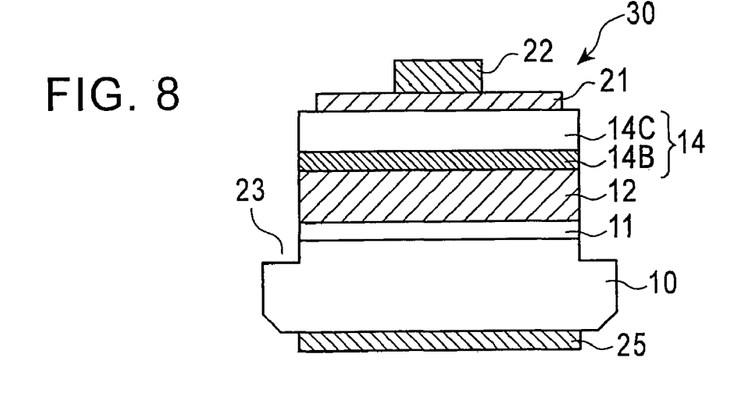
FIG. 8 is a cross-sectional view showing the LED device of a second embodiment of the present invention.

FIG. 8 is a cross-sectional view showing an LED device that is a second embodiment of the present invention. A ZnO layer (11) having a thickness of 30 nm (nanometers), a defect-blocking layer (12), and an LED operating layer (14) are formed in the stated order on a ZnO substrate (10). In the present embodiment, the defect-blocking layer (12) is formed from, for example, a layer of $Mg_xZn_{(1-x)}O$ (x=0.1) having a thickness of 500 nm and doped with Ga (gallium) at a concentration range of $2\text{-}5\times10^{18}$ $cm^{-3}$. The LED operating layer (14) is then formed on the defect-blocking layer (12).

In the present embodiment, the LED operating layer (14) has a constitution comprising a light-emitting layer (14B) and a p-type ZnO-based semiconductor layer (14C). Specifically, the defect-blocking layer (12) also acts as an n-type semiconductor layer (clad layer) of the LED operating layer (14). The constitution of the light-emitting layer (14B) and the p-type ZnO-based semiconductor layer (14C) is the same as in the first embodiment, for example.

The device dividing grooves (23) should be etched to a depth at which at least the LED operating layer (14) and the defect-blocking layer (12) are removed, but it is preferable for the device dividing grooves (23) to be formed to a depth at which at least a part of the substrate (10) is removed, as shown in FIG. 8. This is in order to prevent defects from being directly introduced into the grown layer. The ZnO layer (11) need not be provided.

In this embodiment, a layer of $Mg_xZn_{(1-x)}O$ having a crystal composition that is different from that of the ZnO substrate is used as the defect-blocking layer (12). The crystal of $Mg_xZn_{(1-x)}O$ is compressed in the direction of the a-axis and stretched in the direction of the c-axis, with the stress acting in the opposite direction. The crystal of $Mg_xZn_{(1-x)}O$ is harder than the crystal of ZnO. This constitution enables defects introduced from the device separation part to be effectively blocked at the interface between the substrate and the layer of $Mg_xZn_{(1-x)}O$.

Third Embodiment

Figure 9:
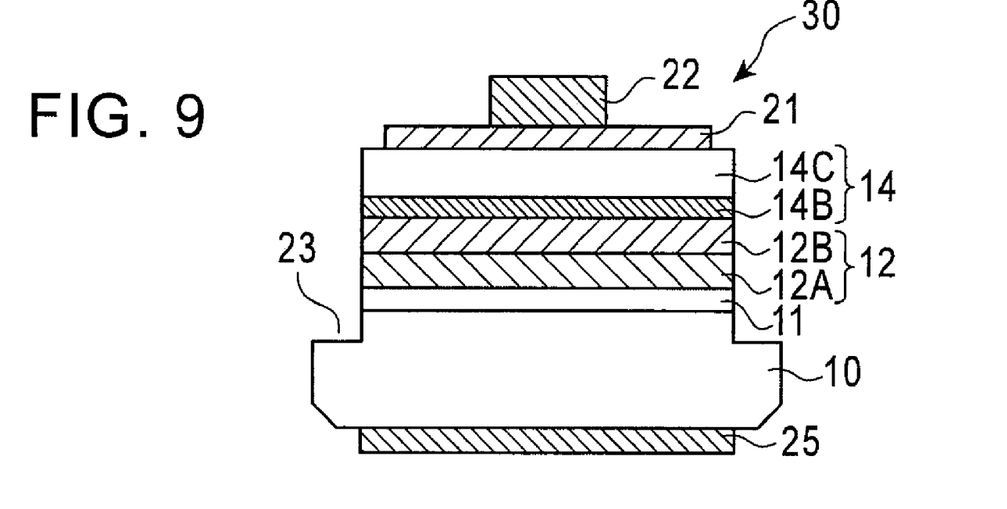
FIG. 9 is a cross-sectional view showing the LED device of a third embodiment of the present invention.

FIG. 9 is a cross-sectional view showing an LED device (30) that is the third embodiment of the present invention. More specifically, the defect-blocking layer (12) in the second embodiment is constituted from two n-type ZnO-based compound semiconductor layers having different crystal compositions; i.e., a first n-type ZnO-based compound semiconductor layer (12A) and a second n-type ZnO-based compound semiconductor layer (12B). More specifically, the first n-type ZnO-based compound semiconductor layer (12A) is, for example, a layer of $Mg_xZn_{(1-x)}O$ (x=0.1) having a thickness of 450 nm and doped with Ga (gallium) at a concentration range of $2\text{-}5\times10^{18}$ $cm^{-3}$, and the second n-type ZnO-based compound semiconductor layer (12B) is, for example, a layer of $Mg_xZn_{(1-x)}O$ (x=0.2) having a thickness of 50 nm and doped with Ga (gallium) at a concentration range of $2\text{-}5\times10^{18}$ $cm^{-3}$. The remaining constitution is the same as in the second embodiment.

In the present embodiment, it is preferable for the device dividing grooves (23) to be formed from the surface side on which the LED operating layer (14) is formed to a depth at which a part of the substrate (10) is removed, as shown in FIG. 9. The device dividing grooves (23) may be formed to a depth that goes beyond the defect-blocking layer (12).

In the present embodiment, a layer of $Mg_xZn_{(1-x)}O$ (x=0.1) (12A) having a crystal composition that is different from that of the ZnO crystal of the substrate, and a layer of $Mg_xZn_{(1-x)}O$ (x=0.2) (12B) are used as the defect-blocking layer (12). Therefore, defects introduced from the device separation part are blocked at the interface between the substrate and the layer of $Mg_xZn_{(1-x)}O$, at the interface between the layer of $Mg_xZn_{(1-x)}O$ (x=0.1) (12A) and the layer of $Mg_xZn_{(1-x)}O$ (x=0.2) (12B), and at the interface between the layer of $Mg_xZn_{(1-x)}O$ (x=0.2) (12B) and the LED operating layer (14).

Fourth Embodiment

Figure 10:
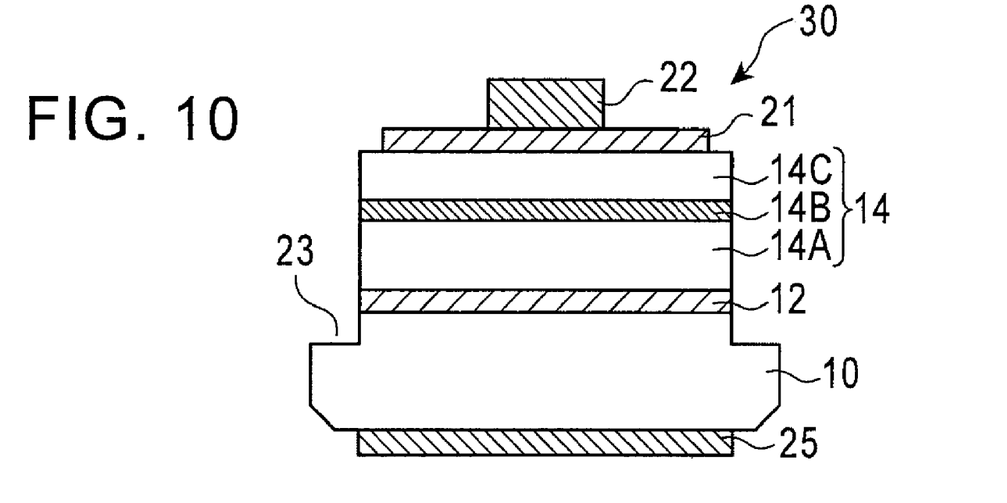
FIG. 10 is a cross-sectional view showing the LED device of a fourth embodiment of the present invention.

FIG. 10 is a cross-sectional view showing an LED device (30) that is a fourth embodiment of the present invention. More specifically, a defect-blocking layer (12) that is a ZnO crystal layer which has a thickness of 30 nm (nanometers) and to which silicon (Si) has been added and an LED operating layer (14) are formed in the stated order on a substrate (10).

The LED operating layer (14) has a constitution whereby an n-type ZnO-based semiconductor layer (14A), a light-emitting layer (14B), and a p-type ZnO-based semiconductor layer (14C) are layered in the stated order. The constitutions of the n-type ZnO-based semiconductor layer (14A), the light-emitting layer (14B), and the p-type ZnO-based semiconductor layer (14C) are the same as in the first embodiment, for example.

More specifically, the defect-blocking layer (12) is a low-temperature growth crystal layer grown at a low temperature (approximately 300° C.), and is a crystal layer comprising a ZnSiO (zinc silicate) grown by adding Si at a concentration range of between $1\times10^{18}$ cm$^{-3}$ and $5\times10^{20}$ cm$^{-3}$. After being grown, this ZnSiO layer is annealed at a high temperature (approximately 800° C.) so as to form the defect-blocking layer (12).

In the present embodiment, the defect-blocking layer (12) is formed directly on the substrate (10) and the device dividing grooves (23) are formed to a depth that goes beyond the defect-blocking layer (12). Specifically, the device dividing grooves (23) are formed from the surface side on which the LED operating layer (14) is formed to a depth at which a part of the substrate (10) is removed.

Figure 11:
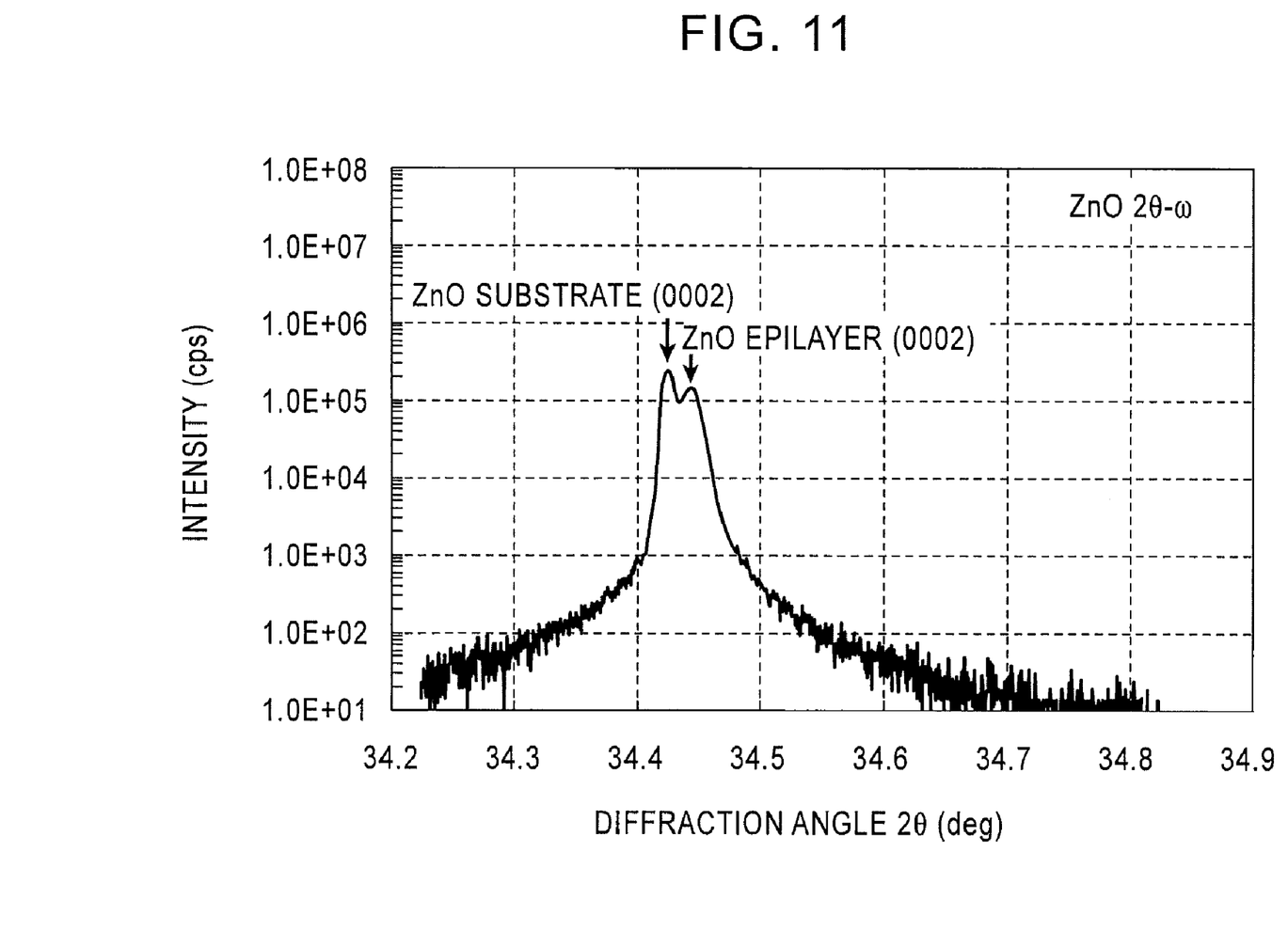
FIG. 11 is a diagram showing a 2θ-ω (X-Ray) diffraction pattern of the (0002) face of an example in which a ZnSiO layer is introduced onto the {0001} face of a ZnO substrate and a ZnO layer is grown on this ZnSiO layer.

FIG. 11 is a diagram showing a 2θ-ω (X-ray) diffraction pattern of the (0002) face of an example in which a ZnSiO layer is grown on the {0001} face of a ZnO substrate and a ZnO layer is grown on this ZnSiO layer. It is thus preferable for there to be a state in which the diffraction peak of the ZnO layer on the ZnSiO layer is observed at a higher angle than the diffraction peak of the ZnO substrate. The lattice constants of the grown ZnO layer are such that the a-axis is longer and the c-axis is shorter than in the lattice constants of the ZnO substrate, and a compressive stress therefore acts on the ZnSiO layer.

Figure 12:
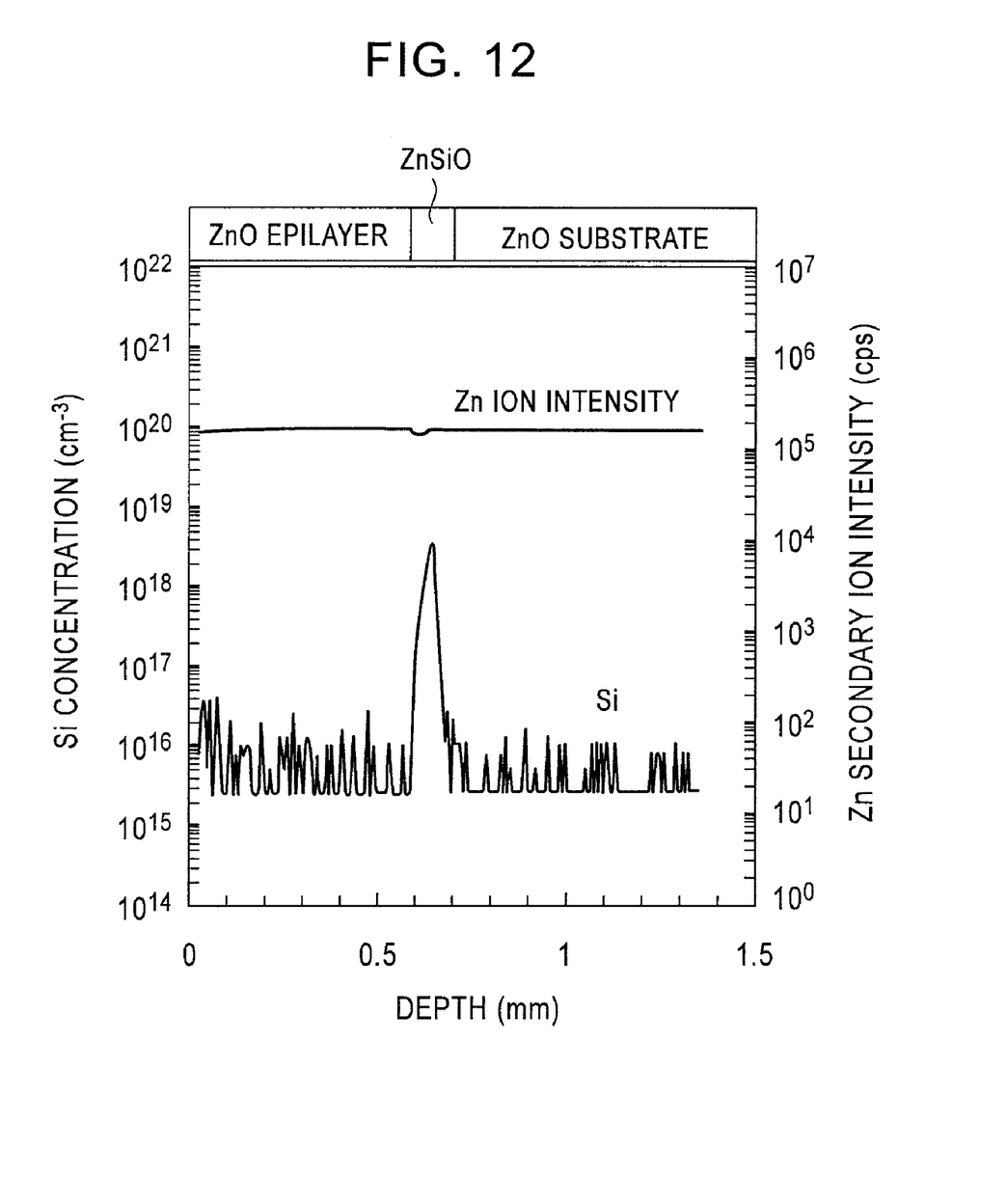
FIG. 12 is a diagram showing the profile in the depth direction of SIMS of the example shown in FIG. 11.

FIG. 12 is a diagram showing the profile in the depth direction of SIMS (secondary ion mass spectrometry) of the example shown in FIG. 11. Even if the concentration of Si in the ZnSiO layer is approximately the same as the concentration of impurities, it is possible to alter the lattice constants of the ZnO grown layer.

In the present embodiment, a compressive stress acts on the defect-blocking layer (12), which is a ZnO crystal to which Si has been added, the direction of defects is changed, or the transmission of defects is stopped, at the interface between the substrate (10) and the defect-blocking layer (12) or at the interface between the defect-blocking layer (12) and the n-type ZnO-based semiconductor layer (14A), and the transmission of defects to the LED (14) operating layer is thereby blocked. In addition, because the device dividing grooves are formed so as to reach the substrate, the transmission of defects from the bottom or the corners of the device dividing grooves (23) to the LED operating layer (14) is blocked.

The embodiments described above can be used in appropriate combinations. For example, it is possible to form a defect-blocking layer by combining the $Mg_xZn_{(1-x)}O$ layer of the first through third embodiments with the ZnSiO layer of the fourth embodiment. Alternatively, it is possible to replace the ZnO layer (11) of the first through third embodiments with a ZnSiO layer. In such cases, in addition to the defect blocking effect due to the distortion of the ZnSiO layer, a defect blocking effect is also achieved due to the presence of a layer having a different crystal composition, hardness, or lattice distortion from the ZnSiO layer, thereby not only increasing the blocking effect, but also achieving a remarkable effect through which different types of lattice defects and dislocations can be effectively blocked.

Examples of LEDs as semiconductor light-emitting devices are described in the embodiments above, but such semiconductor light-emitting devices can also be used as semiconductor lasers or other semiconductor devices.

As described in detail above, the present invention is provided with a defect-blocking layer and device dividing grooves that reach from the surface on which a device operating layer is formed to a depth whereby the defect-blocking layer is removed. Through such a constitution, the transmission of defects from a device separation part to the device operating layer is blocked when a semiconductor device is separated from a wafer. Therefore, it is possible to produce a high-performance semiconductor device having excellent device characteristics, device longevity and mass productivity. In particular, it is possible to produce a high-performance semiconductor device having excellent luminous efficiency, device longevity and mass productivity.

This application is based on Japanese Patent Application No. 2008-234578 which is incorporated herein by reference.

What is claimed is:

1. A method for producing a semiconductor device in which a device operating layer is formed on a zinc oxide (ZnO) substrate, said device operating layer having a laminated structure of zinc oxide-based semiconductor layers, the method comprising:

forming, between said substrate and said device operating layer, a defect-blocking layer having a crystal composition that is different from that of said substrate, and forming a device dividing groove to a depth that goes beyond said defect-blocking layer, relative to a device operating layer side surface of said substrate on which the device operating layer is formed.

2. The production method of claim 1, wherein said device dividing groove is formed to a depth at which a part of said substrate is removed.

3. The production method of claim 1, wherein said defect-blocking layer contains a plurality of ZnO-based compound semiconductor layers that are layered so that mutually adjacent layers have different crystal compositions.

4. The production method of claim 3, wherein said ZnO-based compound semiconductor layers are layers of $Mg_xZn_{(1-x)}O$.

5. The production method of claim 3, wherein said defect-blocking layer is a layer obtained by alternately layering one or more pairs of a layer of $Mg_{x1}Zn_{(1-x1)}O$ and a layer of $Mg_{x2}Zn_{(1-x2)}O$ (x1≠x2), x1 and x2 being such that 0≦(x1, x2)≦0.68 and 0.05≦|x1-x2|≦0.68.

6. The production method of claim 3, wherein said defect-blocking layer is a layer obtained by alternately layering one or more pairs of a layer of $Mg_{x1}Zn_{(1-x1)}O$ and a layer of $Mg_{x2}Zn_{(1-x2)}O$ (x1≠x2), a layer thickness of said layer of $Mg_{x1}Zn_{(1-x1)}O$ layer and said layer of $Mg_{x2}Zn_{(1-x2)}O$ being not less than 1 nm and not more than 50 nm.

7. The production method of claim 1, wherein said defect-blocking layer contains a ZnSiO (zinc silicate) layer.

8. The production method of claim 1, wherein said defect-blocking layer includes a layer having lattice constants that are different from those in said substrate.

9. The production method of claim 2, wherein said device dividing groove is formed to a depth of 0.5 μm or more in part of said substrate.

10. The production method of claim 1, wherein said semiconductor device is a semiconductor light-emitting device and said device operating layer is a light-emitting operating layer.

11. A substrate equipped with a device operating layer, the substrate comprising:

a zinc oxide (ZnO) substrate;

a defect-blocking layer formed on said substrate and having a crystal composition that is different from that of said substrate;

a device operating layer formed on said defect-blocking layer, said device operating layer having a laminated structure of zinc oxide-based semiconductor layers; and a device dividing groove formed to a depth that goes beyond said defect-blocking layer, relative to a surface of said device operating layer.

12. The device operating layer-equipped substrate of claim 11, wherein said device dividing groove is formed to a depth at which a part of said substrate is removed.

13. The device operating layer-equipped substrate of claim 11, wherein said defect-blocking layer contains a plurality of ZnO-based compound semiconductor layers, which are layered so that mutually adjacent layers have different crystal compositions.

14. The device operating layer-equipped substrate of claim 13, wherein said ZnO-based compound semiconductor layers are layers of $Mg_xZn_{(1-x)}O$.

15. The device operating layer-equipped substrate of claim 13, wherein said defect-blocking layer is obtained by alternately layering one or more pairs of a layer of $Mg_{x1}Zn_{(1-x1)}O$ and a layer of $Mg_{x2}Zn_{(1-x2)}O$ (x1≠x2), and x1 and x2 are such that $0 \leqq (x1, x2) \leqq 0.68$ and $0.05 \leqq |x1-x2| \leqq 0.68$.

16. The device operating layer-equipped substrate of claim 13, wherein said defect-blocking layer is obtained by alternately laminating one or more pairs of a layer of $Mg_{x1}Zn_{(1-x1)}O$ and a layer of $Mg_{x2}Zn_{(1-x2)}O$ layer (x1≠x2), and a layer thickness of said $Mg_{x1}Zn_{(1-x1)}O$ layer and said $Mg_{x2}Zn_{(1-x2)}O$ layer is not less than 1 nm and not more than 50 nm.

17. The device operating layer-equipped substrate of claim 11, wherein said defect-blocking layer contains a ZnSiO (zinc silicate) layer.

18. The device operating layer-equipped substrate of claim 11, wherein said defect-blocking layer contains a layer having a lattice constant that is different from that in said substrate.

19. The device operating layer-equipped substrate of claim 12, wherein said dividing groove is formed to a depth of 0.5 μm or more in part of said substrate.

20. The device operating layer-equipped substrate of claim 11, wherein said device operating layer is a light-emitting operating layer.

21. A semiconductor device obtained by breaking and segmenting the device operating layer-equipped substrate of claim 11 along said device dividing groove.

22. The semiconductor device of claim 21, wherein said device operating layer is a light-emitting operating layer.

* * * * *